United States Patent
Kozuki (10) Patent No.: US 9,711,707 B2
(45) Date of Patent: Jul. 18, 2017

(54) METHOD FOR MANUFACTURING AN ELECTRONIC DEVICE

(71) Applicant: Seiko Instruments Inc., Chiba-shi, Chiba (JP)

(72) Inventor: Atsushi Kozuki, Chiba (JP)

(73) Assignee: SEIKO INSTRUMENTS INC., Chiba (JP)

( * ) Notice: Subject to any disclaimer, the term of this patent is extended or adjusted under 35 U.S.C. 154(b) by 262 days.

(21) Appl. No.: 14/161,167

(22) Filed: Jan. 22, 2014

(65) Prior Publication Data

US 2014/0203688 A1    Jul. 24, 2014

(30) Foreign Application Priority Data

Jan. 23, 2013   (JP) .................................. 2013-010538

(51) Int. Cl.
*H01L 41/053*   (2006.01)
*H03H 9/10*   (2006.01)
(Continued)

(52) U.S. Cl.
CPC ...... *H01L 41/0533* (2013.01); *H01L 41/0477* (2013.01); *H01L 41/053* (2013.01);
(Continued)

(58) Field of Classification Search
CPC ............... H01L 41/0477; H01L 41/053; H01L 41/0533; H01L 41/23; H01L 41/29; H01L 41/293; H01L 41/297; H01L 2924/00; H01L 2924/0002; H01L 21/76898; H01L 23/481; H03H 3/007; H03H 2003/022; H03H 9/10; H03H 9/1014; H03H 9/1021;
(Continued)

(56) References Cited

U.S. PATENT DOCUMENTS

2002/0149101 A1*  10/2002  Ikeda .................. H01L 41/0477
                                                                            257/703
2006/0131731 A1*   6/2006  Sato ....................... H03H 9/105
                                                                            257/704
(Continued)

FOREIGN PATENT DOCUMENTS

JP            10032456 A    *  2/1998
JP         2011-155506 A        8/2011
JP          2012015363 A    *  1/2012

*Primary Examiner* — A. Dexter Tugbang
(74) *Attorney, Agent, or Firm* — Brinks Gilson & Lione (57) ABSTRACT

A method for manufacturing an electronic device includes a through electrode forming step of forming a through electrode on an insulating base substrate; an electronic element mounting step of mounting an electronic element on one surface of the base substrate; a cover body placing step of bonding a cover body accommodating the electronic element; a conductive film forming step of forming a conductive film on the other surface of the base substrate and on an end face of the through electrode exposing on the other surface; an electrode pattern forming step of forming an electrode pattern on the end face of the through electrode and on the surface of the periphery of the end face while leaving the conductive film; and an external electrode forming step of forming an external electrode by accumulating an electroless plated film on the surface of the electrode pattern by an electroless plating method.

6 Claims, 5 Drawing Sheets

(51) Int. Cl.
*H03H 3/007* (2006.01)
*H01L 41/23* (2013.01)
*H01L 41/293* (2013.01)
*H01L 41/29* (2013.01)
*H01L 41/047* (2006.01)
*H01L 41/297* (2013.01)
*H03H 3/02* (2006.01)
*H01L 23/48* (2006.01)
*H01L 21/768* (2006.01)

(52) U.S. Cl.
CPC ............ *H01L 41/23* (2013.01); *H01L 41/29* (2013.01); *H01L 41/293* (2013.01); *H01L 41/297* (2013.01); *H03H 9/105* (2013.01); *H03H 9/1014* (2013.01); *H03H 9/1021* (2013.01); *H03H 9/1057* (2013.01); *H03H 9/1071* (2013.01); *H03H 9/1092* (2013.01); *H01L 21/76898* (2013.01); *H01L 23/481* (2013.01); *H01L 2924/00* (2013.01); *H01L 2924/0002* (2013.01); *H03H 3/007* (2013.01); *H03H 9/10* (2013.01); *H03H 2003/022* (2013.01); *Y10T 29/42* (2015.01); *Y10T 29/4913* (2015.01); *Y10T 29/49155* (2015.01)

(58) Field of Classification Search
CPC .... H03H 9/105; H03H 9/1057; H03H 9/1071; H03H 9/1092; Y10T 29/42; Y10T 29/4913; Y10T 29/49155
See application file for complete search history.

(56) References Cited

U.S. PATENT DOCUMENTS

| | | | | |
|---|---|---|---|---|
| 2010/0270891 | A1* | 10/2010 | Kohda | H03H 9/1035 310/344 |
| 2010/0326721 | A1* | 12/2010 | Nakamura | H03H 9/1021 174/549 |
| 2011/0027987 | A1* | 2/2011 | Takahashi | H01L 21/76898 438/652 |
| 2011/0043078 | A1* | 2/2011 | Tsuda | Y10T 29/42 310/364 |
| 2012/0153779 | A1* | 6/2012 | Sato | H03H 9/1021 310/344 |

* cited by examiner

METHOD FOR MANUFACTURING AN ELECTRONIC DEVICE

RELATED APPLICATIONS

This application claims priority under 35 U.S.C. §119 to Japanese Patent Application No. 2013-010538 filed on Jan. 23, 2013, the entire content of which is hereby incorporated by reference.

BACKGROUND OF THE INVENTION

Field of the Invention

The present invention relates to a method for manufacturing an electronic device in which an electronic element such as a quartz crystal vibrator is accommodated in a package, an electronic device, and an oscillator using the same.

Description of the Related Art

Surface mount type electronic devices have hitherto been frequently used in cellular phones and portable information terminals. Above all, in a quartz crystal vibrator, MEMS, a gyroscope, an acceleration sensor, and the like, a hollow cavity is formed in the inside of a package, and an electronic element such as a quartz crystal vibrator and MEMS is enclosed in this cavity. A glass material is used as the package. For example, an electronic element is mounted on a base substrate, and a glass cover is bonded thereon by means of anodic bonding, whereby the electronic element is sealed hermetically. The anodic bonding between glasses brings about such advantages as high airtightness and inexpensiveness.

Figure 7:
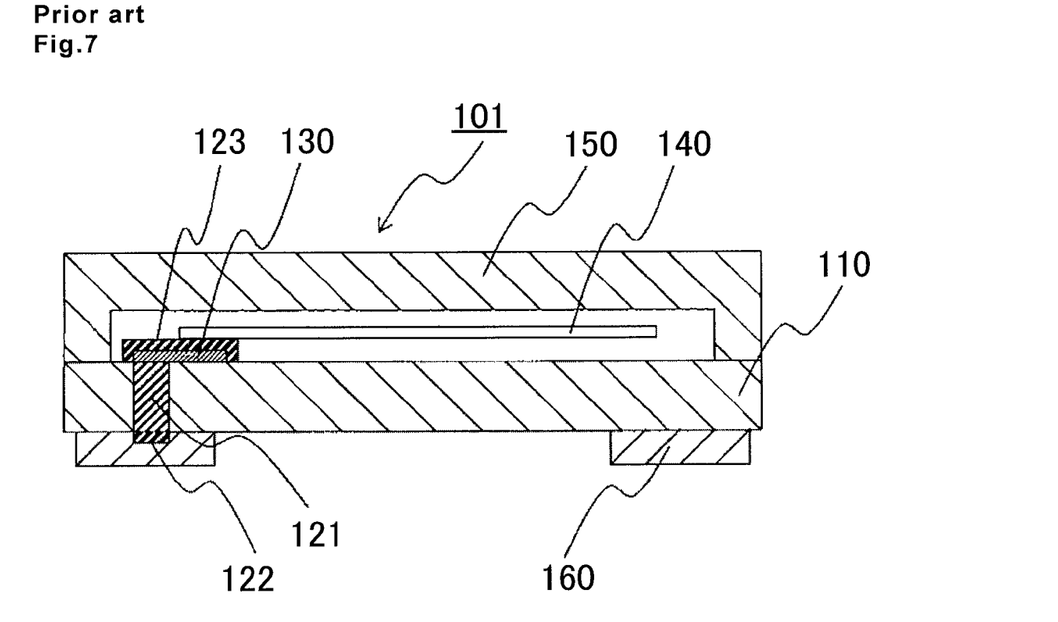
FIG. 7 is a cross-sectional view of a conventionally known electronic device.

FIG. 7 is a cross-sectional view of an electronic device of this type (FIG. 1 of JP-A-2011-155506 (Patent Document 1)). An electronic device 101 includes a base 110, an electronic component 140 mounted on the base 110, and a cap 150 bonded to the base 110 while accommodating the electronic component 140 therein. In the base 110, a through electrode 121 penetrating in a plate thickness direction, a first metal film 122 electrically connected to the through electrode 121, and a circuit pattern 130 and a second metal film 123 each electrically connecting the through electrode 121 and the electronic component 140 to each other are formed. An external electrode 160 composed of a metal film is formed in the outside of the first metal film 122.

Here, an iron-nickel based alloy is used for the through electrode 121. Gold which is formed by an electroless plating method is used for the first metal film 122. In addition, a non-illustrated low-melting point glass is used between the through electrode 121 and the base 110, thereby enhancing the airtightness by means of heat welding. When it is intended to conduct heat welding using a low-melting point glass, thereby enhancing the airtightness between the through electrode 121 and the base 110, an oxide film is formed on an end face of the through electrode 121, so that the conductivity with other metal is lowered. Then, the oxidation of the through electrode 121 is prevented from occurring by removing the oxide film formed at the time of heat welding of the through electrode 121 and then forming the first metal film 122 or the second metal film 123 on the end face of the through electrode 121.

SUMMARY OF THE INVENTION

In Patent Document 1, an iron-nickel based alloy is used as the through electrode 121, and a gold thin film is used as the first metal film 122 for preventing the oxidation of the through electrode 121 from occurring. Furthermore, the external electrode 160 is formed of a metal thin film made of a sputtered film or a vapor deposited film, or is formed using a conductive adhesive such as a silver paste. However, the external electrode 160 is required to be formed in a thickness of several μm, and the sputtering method or vapor deposition method is slow in a film forming rate, so that it takes a long time to form the external electrode 160. In addition, when the external electrode 160 is formed using a conductive adhesive such as a silver paste, it is difficult to completely block moisture due to a pinhole or the like. A difference in ionization tendency between the iron-nickel based alloy and gold is so large that when moisture or the like is attached between the through electrode 121 and the first metal film 122, the through electrode 121 is corroded due to a battery effect, resulting in causing a lowering of conductivity. In addition, in Patent Document 1, a low-melting point glass is used between the through electrode 121 and the base 110, and a gold thin film of the first metal film 122 is formed on the end face of the through electrode 121 by an electroless plating method. Since it is difficult to form a gold thin film on the low-melting point glass by an electroless plating method, a boundary portion between the through electrode 121 and the first metal film 122 is exposed, so that the corrosion is easily advanced.

A method for manufacturing an electronic device according to the present invention includes a through electrode forming step of forming a through electrode on an insulating base substrate; an electronic element mounting step of mounting an electronic element on one surface of the base substrate; a cover body placing step of bonding a cover body accommodating the electronic element therein to the base substrate; a conductive film forming step of forming a conductive film on the other surface of the base substrate and on an end face of the through electrode exposing on the other surface; an electrode pattern forming step of forming an electrode pattern on the end face of the through electrode and on the surface of the periphery of the end face while leaving the conductive film; and an external electrode forming step of forming an external electrode by accumulating an electroless plated film on the surface of the electrode pattern by an electroless plating method.

In addition, the external electrode forming step is conducted after the electronic element mounting step and the cover body placing step.

In addition, after the external electrode forming step, a metal film forming step of forming a metal film on the surface of the electroless plated film is included.

In addition, the through electrode is composed of an iron-nickel based alloy.

In addition, the electroless plated film is a nickel film or a copper film.

In addition, the metal film is a gold thin film.

In addition, the electroless plated film has a thickness of from 1 μm to 10 μm.

In addition, the electronic element is a quartz crystal vibrating piece.

An electronic device according to the present invention includes an insulating base substrate having plural through electrodes formed thereon, an electronic element mounted on one surface of the base substrate, and a cover body bonded to the base substrate while accommodating the electron element therein, wherein an external electrode is formed on an end face of the through electrode exposing on the other surface of the base substrate and on the other surface of the periphery of the end face; and the external electrode has a conductive film and an electroless plated film formed on the surface of the conductive film by an electroless plating method.

In addition, the through electrode is composed of an iron-nickel based alloy, the conductive film is composed of a metal film, and the electroless plated film is composed of nickel or copper.

An oscillator according to the present invention includes the electronic device as set forth above and a drive circuit supplying a drive signal to the electronic device.

The method for manufacturing an electronic device according to the present invention is a method including a through electrode forming step of forming a through electrode on an insulating base substrate; an electronic element mounting step of mounting an electronic element on one surface of the base substrate; a cover body placing step of bonding a cover body accommodating the electronic element therein to the base substrate; a conductive film forming step of forming a conductive film on the other surface of the base substrate and on an end face of the through electrode exposing on the other surface; an electrode pattern forming step of forming an electrode pattern on the end face of the through electrode and on the surface of the periphery of the end face while leaving the conductive film; and an external electrode forming step of forming an external electrode by accumulating an electroless plated film on the surface of the electrode pattern by an electroless plating method. According to this, an electronic device in which the corrosion of the through electrode is prevented from occurring can be manufactured within a short time.

BRIEF DESCRIPTION OF THE DRAWINGS

FIGS. 3(S1) to 3(S5) are each an explanatory view of a manufacturing process of an electronic device according to Second Embodiment of the present invention.

FIGS. 4(S6) to 4(S7) are each an explanatory view of a manufacturing process of an electronic device according to Second Embodiment of the present invention.

DETAILED DESCRIPTION OF THE PREFERRED EMBODIMENTS

First Embodiment

Figure 1:
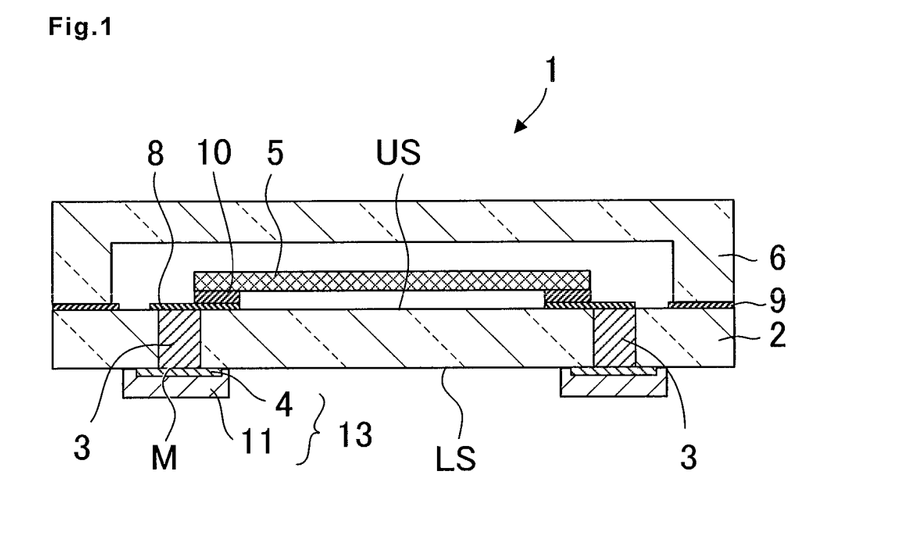
FIG. 1 is a cross-sectional schematic view of an electronic device according to First Embodiment of the present invention.

FIG. 1 is a cross-sectional schematic view of an electronic device 1 according to First Embodiment of the present invention. The electronic device 1 includes a base substrate 2, a cover body 6 bonded thereonto, and an electronic element 5 accommodated in the inside thereof. The base substrate 2 has insulating properties and has plural through electrodes 3 penetrating from one surface US to the other surface LS thereof. On the one surface US of the base substrate 2, a wiring electrode 8 is formed so as to cover an end face of the through electrode 3, and the electronic element 5 is mounted on the wiring electrode 8 via a metal bump 10. The cover body 6 has a recess in the center thereof and is bonded to the one surface US of the base substrate 2 via a bonding material 9 while accommodating the electronic element 5 in this recess. The base substrate 2 further has an external electrode 13 formed on an end face M of the through electrode 3 exposing on the other surface LS of the base substrate 2 and on the other surface LS of the periphery of the end face M. The external electrode 13 has a stack structure in which a conductive film 4 and an electroless plated film 11 formed on the surface of the conductive film 4 by an electroless plating method are stacked.

In this way, the end face M of the through electrode 3 formed on the base substrate 2 and exposing on the other surface LS and the other surface LS located in the vicinity of the periphery thereof are completely covered by the conductive film 4, and furthermore, the surface of the conductive film 4 including an upper face and a side face thereof is covered by the electroless plated film 11. Accordingly, the through electrode 3 does not come into contact with moisture or the like, so that its corrosion is prevented from occurring. It is to be pointed out that a metal film for preventing the oxidation from occurring can be formed on the surface of the electroless plated film 11, and the metal film can be formed so as to cover the surface of the electroless plated film 11.

A glass, a ceramic, a plastic, a glass epoxy resin, and the like can be used for the base substrate 2. A piezoelectric vibrating piece, MEMS, an acceleration sensor, a light emitting element, a light receiving element, and other semiconductor elements can be used for the electronic element 5. An iron-nickel based alloy such as Kovar, invar, permalloy, 42 Alloy, and stainless steel, and other metal materials can be used for the through electrode 3. A nickel film, a copper film, and other metal films can be used for the electroless plated film 11.

Second Embodiment

Figure 2:
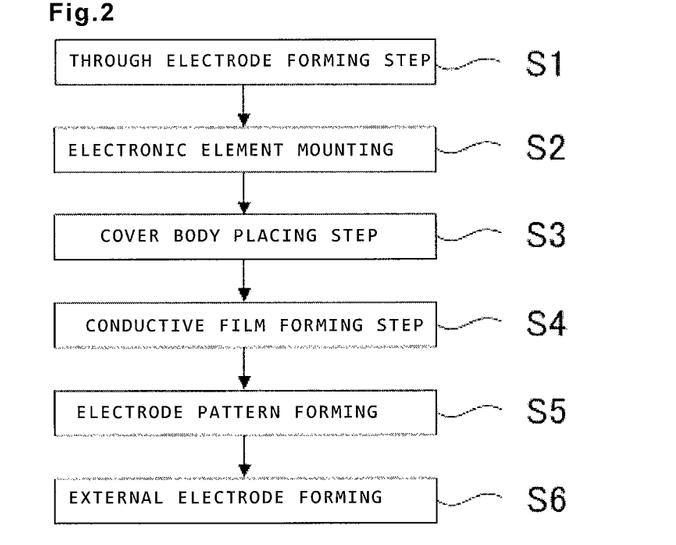
FIG. 2 is a flow chart expressing a method for manufacturing an electronic device according to Second Embodiment of the present invention.
Figure 3:
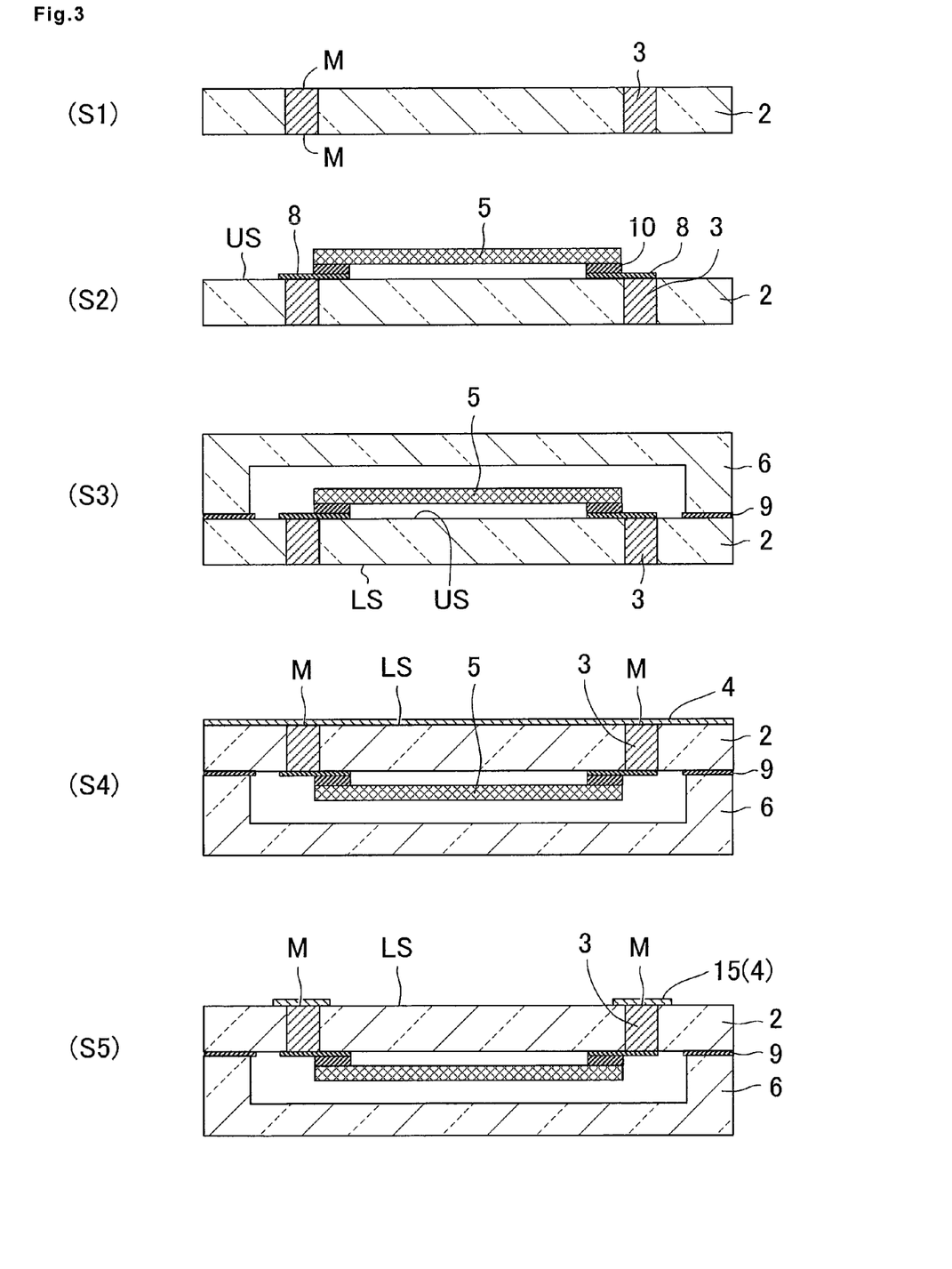

FIG. 2 is a flow chart expressing a method for manufacturing an electronic device according to Second Embodiment of the present invention. FIGS. 3(S1) to 3(S5) and FIGS. 4(S6) to 4(S7) are each an explanatory view of each step in the method for manufacturing an electronic device according to the Second Embodiment of the present invention. The same symbols are given in the same portions or portions having the same functions, respectively.

As shown in FIG. 2, the method for manufacturing an electronic device according to the present invention includes a through electrode forming step S1, an electronic element mounting step S2, a cover body placing step S3, a conductive film forming step S4, an electrode pattern forming step S5, and an external electrode forming step S6. In the through electrode forming step S1, a through electrode is formed on an insulating base substrate in a plate thickness direction thereof. In the electronic element mounting step S2, an electronic element is mounted on one surface of the base substrate. In the cover body placing step S3, a cover body accommodating the electronic element therein is bonded to the base substrate. In the conductive film forming step S4, a conductive film is formed on the other surface of the base substrate and on an end face of the through electrode exposing on the other surface. In the electrode pattern forming step S5, the conductive film is left on the end face of the through electrode and on the surface of the periphery thereof, and the conductive film in other region is removed, thereby forming an electrode pattern. In the external electrode forming step S6, an electroless plated film is accumulated on the surface of the electrode pattern by an electroless plating method, thereby forming an external electrode.

It is to be pointed out that the manufacturing method according to the present invention may also be a method in which after the through electrode forming step S1 and before the electronic element mounting step S2, a conductive film is formed on the other surface of the base substrate by the conductive film forming step S4; subsequently, the electrode pattern forming step S5 is conducted; subsequently, the external electrode forming step S6 is conducted; subsequently, in the electronic element mounting step S2, an electronic element is mounted on the one surface of the base substrate; and finally, the cover body placing step S3 is conducted. In addition, after the cover body placing step S3 and before the conductive film forming step S4, a grinding step of grinding or polishing the other surface of the base substrate 2 to make the end face of the through electrode and the other surface of the base substrate flush with each other and also removing an oxide film formed on the end face can be added.

According to this, a lowering of conductivity between the conductive film and the through electrode can be prevented from occurring. In addition, after the external electrode forming step S6, a metal film forming step S7 of forming a metal film on the surface of the electroless plated film can also be included. The method for manufacturing an electronic device according to the present invention is hereunder specifically described.

FIG. 3(S1) is a cross-sectional schematic view expressing a state in which in the through electrode forming step S1, the through electrode 3 is formed on the insulating base substrate 2. As the base substrate 2, for example, an insulating substrate such as a glass substrate, a plastic substrate, and a glass epoxy resin substrate can be used. As the through electrode 3, an iron-nickel based alloy such as Kovar, invar, permalloy, 42 Alloy, and stainless steel, and other metal materials can be used. When a glass substrate is used as the base substrate 2, and Kovar is used as the through electrode 3, both of them are approximate to each other in terms of a coefficient of thermal expansion, so that a package with high reliability can be configured. An example of using a glass substrate as the base substrate 2 and using an iron-nickel based alloy as the through electrode 3 is hereunder described.

The base substrate 2 composed of a glass is softened or fused and subjected to die forming to form a through hole. A wire material of an iron-nickel based alloy is filled in the through hole and heated and softened to weld the wire material and the glass to each other. After cooling the glass, both the surfaces thereof are flattened by means of polishing, and not only the end face M of the through electrode 3 is exposed to remove the oxide film, but the end face M and the surface of the base substrate 2 are formed flush with each other. The flattened base substrate 2 has a thickness of, for example, from 0.2 mm or 1 mm. It is to be pointed out that the through hole of the base substrate 2 can also be formed by a sand blast method or an etching method.

FIG. 3(S2) is a cross-sectional schematic view expressing a state in which in the electronic element mounting step S2, the electronic element 5 is mounted on the base substrate 2. The metal film is formed on the one surface US by a vapor deposition method, a sputtering method, or the like, and patterning of the metal film is conducted by photolithography and an etching method to form the wiring electrode 8. The wiring electrode 8 may also be formed by a printing method in addition to the vapor deposition method or the sputtering method. Subsequently, the electronic element 5 is placed on the base substrate 2 via the metal bump 10 by means of surface mounting. In place of the surface mounting, the electronic element 5 may also be adhered onto the surface of the base substrate 2 by using an adhesive or the like, followed by electrically connecting the wiring electrode 8 and the electronic element 5 to each other by means of wire bonding. In the case where the electronic element 5 is a piezoelectric vibrating piece, the piezoelectric vibrating piece can be mounted in a cantilever form on the one surface US of the base substrate 2.

FIG. 3(S3) is a cross-sectional schematic view expressing a state in which in the cover body placing step S3, the cover body 6 is bonded onto the one surface US of the base substrate 2. As the cover body 6, the same material as that in the base substrate 2, for example, a glass material, can be used. The cover body 6 includes a recess in the center thereof, and the bonding material 9 is previously formed on an upper end face of the recess. As the bonding material 9, for example, a conductive film such as an aluminum film, a chromium film, and a silicon film, or a composite layer thereof is formed by a vapor deposition method, a sputtering method, or the like. Then, the electronic element 5 is accommodated in the recess of the center, and the base substrate 2 and the cover body 6 are bonded to each other by means of anodic bonding. On the occasion of bonding, when the periphery thereof is evacuated in vacuo, the inside of a package in which the electronic element 5 is accommodated can be evacuated in vacuo. For example, in the case of using a quartz crystal vibrating piece as the electronic element 5, when the inside of the package is kept in vacuo, the air resistance against physical vibration of the quartz crystal vibrating piece can be eliminated. It is to be pointed out that a space between the base substrate 2 and the cover body 6 can also be bonded to each other by means of, in addition to the anodic bonding, intermetallic bonding or bonding with an adhesive depending upon an application.

FIG. 3(S4) is a cross-sectional schematic view expressing a state in which in the conductive film forming step S4, the conductive film 4 is formed on the other surface LS of the base substrate 2. The other surface LS of the base substrate 2 is polished or washed to remove the oxide film of the end face M. Subsequently, the conductive film 4 of a metal is accumulated in a thickness of from 0.05 μm to 0.5 μm on the other surface LS by a vapor deposition method or a sputtering method. The conductive film 4 is accumulated spread over the end faces M of the plural through electrodes 3. The conductive film 4 is formed spread over the plural end faces M. As the conductive film 4, in addition to a titanium film, a metal film such as a nickel film and a copper film can be used. In the case of using a metal film as the conductive film 4, a material with good adhesion to the end face M and the base substrate 2 is selected. In addition, it is desirable to select a material having a small difference in ionization tendency relative to the metal film formed in an upper portion of the conductive film 4.

FIG. 3(S5) is a cross-sectional schematic view expressing a state in which in the electrode pattern forming step S5, the conductive film 4 is left on the end face M of the through electrode 3 and the surface of the periphery thereof, and the conductive film 4 in other region is removed, thereby forming an electrode pattern 15. A photosensitive resin film composed of a resist is placed on the surface of the conductive film 4 by means of coating or sticking, and then exposed and developed to form a mask in the region where the conductive film 4 is left. In place of the formation of a mask from the photosensitive resin film, the mask may be formed by a printing method. The conductive film 4 is removed from the region other than the pattern of the mask by a wet etching method using an acid or alkali solution or a dry etching method using a reactive gas. Thereafter, the mask is removed to form the electrode pattern 15 composed of the conductive film 4 on the end face M of the through electrode 3 and the surface of the periphery thereof.

Figure 4:
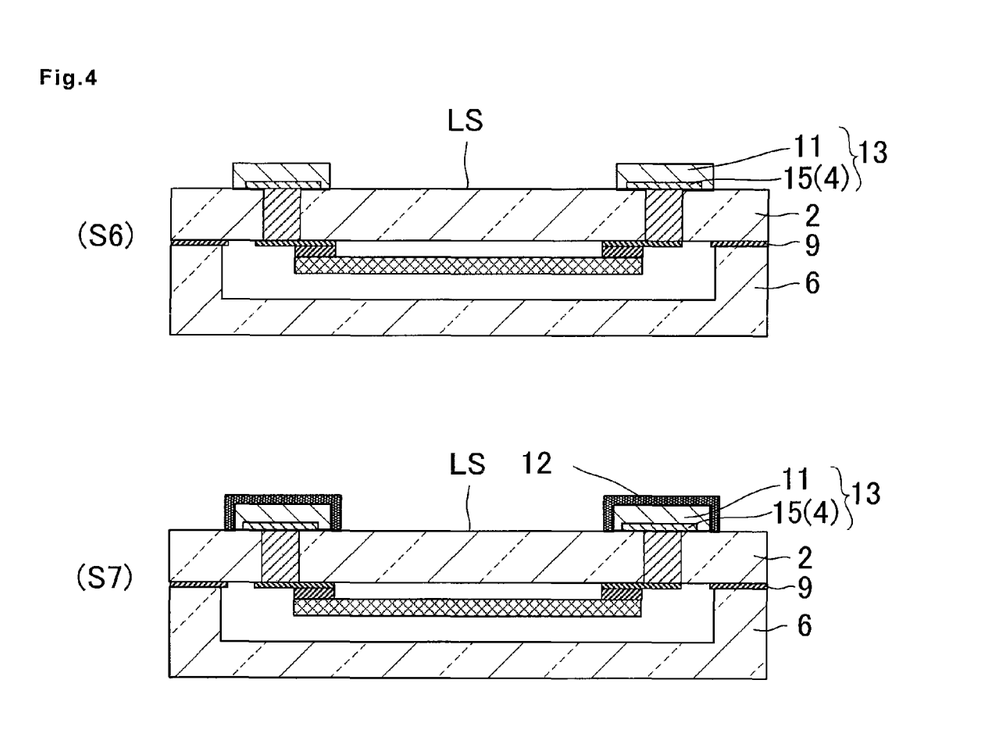

FIG. 4(S6) is a cross-sectional schematic view expressing a state in which in the external electrode forming step S6, the electroless plated film 11 is accumulated on the surface of the electrode pattern 15 (conductive film 4). The electroless plated film 11 is accumulated on the surface of the electrode pattern 15 by an electroless plating method, thereby forming the external electrode 13. The electroless plated film 11 is formed in such a manner that the other surface LS is immersed in an electroless plating solution, thereby allowing the conductive film 4 to cover the whole of the exposed face exposing on the side of the other surface LS. Namely, the electroless plated film 11 is also formed on a side face of the electrode pattern 15 in addition to the upper face thereof. A thickness of the electroless plated film 11 is from 1 μm to 10 μm, and preferably from 1 μm to 5 μm. In addition, as the electroless plated film 11, in addition to a nickel film, a copper film or other metal film can be formed.

In addition, as shown in FIG. 4(S7), after the external electrode forming step S6, a metal film forming step of forming a metal film 12 on the surface of the electroless plated film 11 can be added. For the purpose of preventing the oxidation of the surface of the electroless plated film 11 from occurring, thereby ensuring the conductivity, the metal film 12 composed of a thin film which is made of a metal having a small ionization tendency, such as gold, silver, and platinum, can be formed by an electroless plating method. The metal film 12 can be formed so as to cover the whole of the exposed surface of the electroless plated film 11. It is to be pointed out that the metal film 12 may also be formed by a vapor deposition method or a sputtering method in place of the electroless plating method. In addition, a stacked electrode of the electrode pattern 15, the electroless plated film 11, and the metal film 12 may also be used as the external electrode 13.

In this way, the electrode pattern 15 is formed on the end face M of the through electrode 3 and on the surface of the periphery thereof, and thereafter, the electroless plated film 11 is formed on the surface of the electrode pattern 15 by an electroless plating method. Therefore, the end face M of the through electrode 3 is completely sealed hermetically by the electrode pattern 15, and furthermore, the exposed surface of the electrode pattern 15 is completely covered by the electroless plated film 11. As a result, the corrosion of the through electrode 3 is prevented from occurring. Furthermore, as compared with the sputtering method or vapor deposition method, the electroless plated film 11 can be fabricated within a short time, and the electronic device 1 with high reliability can be manufactured within a short time.

Third Embodiment

Figure 5:
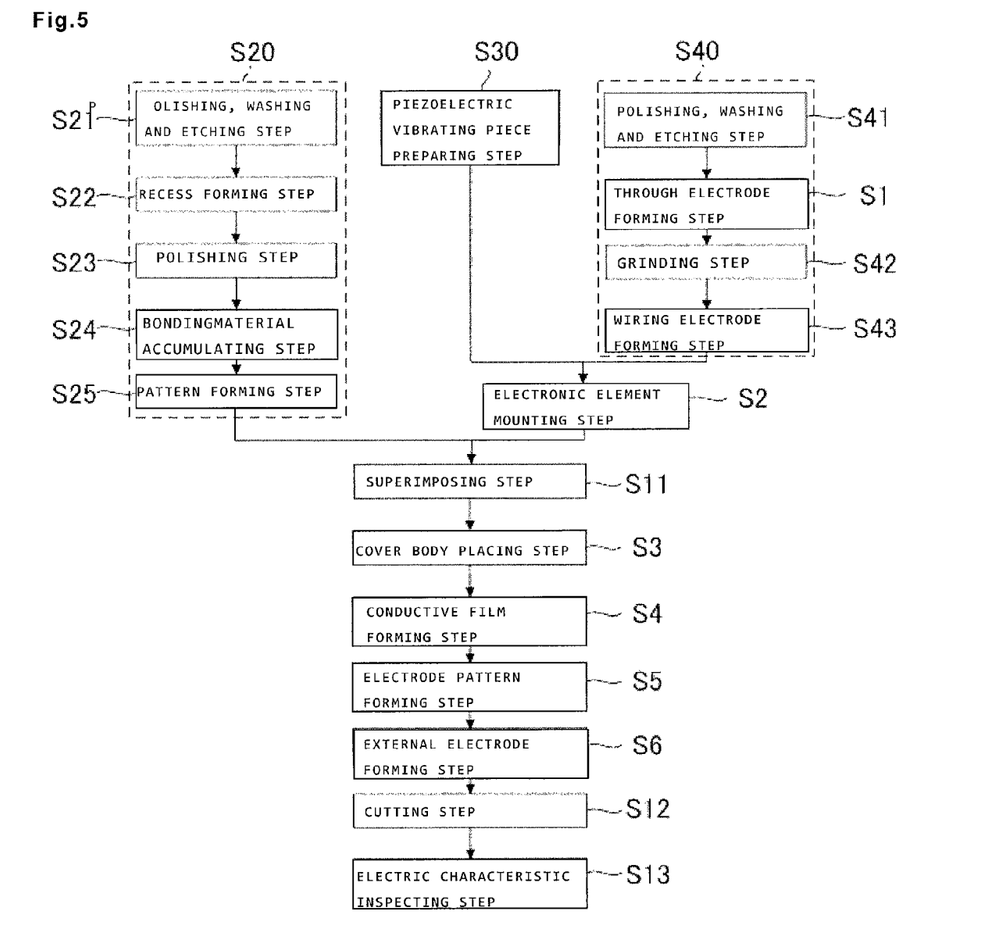
FIG. 5 is a flow chart expressing a method for manufacturing an electronic device according to Third Embodiment of the present invention.

FIG. 5 is a flow chart expressing a method for manufacturing an electronic device according to Third Embodiment of the present invention. The Third Embodiment is concerned with a specific example of manufacturing an electronic device composed of a piezoelectric vibrator in which a piezoelectric vibrating piece is mounted as an electronic element. It is to be pointed out that the present embodiment is concerned with a manufacturing method in which a glass wafer having a lot of recesses formed therein and a glass wafer having a lot of electronic elements mounted thereon are superimposed on and bonded to each other, thereby simultaneously forming a lot of electronic devices 1. The same symbols are given in the same steps, respectively.

The electronic element which is mounted on the base substrate is a piezoelectric vibrating piece composed of a quartz crystal vibrator or the like. A cover body forming step S20 is described. A plate-shaped glass wafer composed of a soda-lime glass is prepared. First of all, in a polishing, washing and etching step S21, the glass wafer is polished to a prescribed thickness and washed, and thereafter, an etching treatment is conducted to remove a work-affected layer of the outermost surface. Subsequently, in a recess forming step S22, a recess is formed in a central portion of a region where each electronic device is formed by means of die forming with a heat press. Subsequently, in a polishing step S23, an upper end face of the periphery of the recess is subjected to polishing processing into a flat mirror-finished surface. Subsequently, in a bonding material accumulating step S24, a bonding material composed of, for example, aluminum is accumulated in a thickness of from 50 nm to 150 nm on the surface of the cover body having a recess formed therein by a sputtering method or a vapor deposition method. Subsequently, in a pattern forming step S25, the bonding material is removed from the surface other than the upper end face of the periphery of the recess by photolithography and an etching method. In this way, a cover body composed of a glass wafer is formed.

A piezoelectric vibrating piece preparing step S30 is described. A rough stone of quartz crystal is sliced at a prescribed angle, a quartz crystal wafer is formed, and subsequently, the quartz crystal wafer is subjected to grinding and polishing processing to a fixed thickness. Subsequently, a work-affected layer of the quartz crystal wafer is removed by conducting an etching treatment. Subsequently, a metal film is accumulated on both the surfaces of the quartz crystal wafer, and the metal film is subjected to patterning by photolithography and an etching method and processed into an excitation electrode, a wiring electrode, and a mount electrode, respectively, each having a prescribed shape. Subsequently, the quartz crystal wafer is processed into an outer shape of a piezoelectric vibrating piece by photolithography and an etching method or dicing.

A base substrate forming step S40 is described. A plate-shaped glass wafer composed of a soda-lime glass is prepared. First of all, in a polishing, washing and etching step S41, the glass wafer is polished to a prescribed thickness and washed, and thereafter, an etching treatment is conducted to remove a work-affected layer of the outermost surface. Subsequently, in a through electrode forming step S1, a through hole is formed in a plate thickness direction of the glass wafer by means of die forming with a heat press, or placing a mask on the surface and then conducting an etching treatment or grinding by sand blast. Subsequently, a through electrode composed of an iron-nickel based alloy is embedded in this through hole. Subsequently, in a grinding step S42, both the end portions of the through electrode and both the surfaces of the glass wafer are ground and flattened, thereby exposing an end face of the through electrode to form a base substrate. Subsequently, in a wiring electrode forming step S43, a metal film is accumulated on one surface of the base substrate by a sputtering method or a vapor deposition method and subjected to patterning into a wiring electrode by photolithography and an etching method.

Subsequently, in an electronic element mounting step S2, the piezoelectric vibrating piece is mounted on the one surface of the base substrate. On the occasion of mounting, a conductive adhesive or a metal bump is placed on the wiring electrode of the base substrate, and the mount electrode of the piezoelectric vibrating piece is bonded thereonto, thereby immobilizing the piezoelectric vibrating piece in a cantilever form onto the base substrate. According to this, the through electrode and the excitation electrode of the piezoelectric vibrating piece are electrically connected to each other. In this way, a base substrate composed of a glass wafer having a lot of piezoelectric vibrating pieces mounted thereon is formed.

Subsequently, in a superimposing step S11, a cover body is placed on the base substrate such that the piezoelectric vibrating piece is accommodated in each recess of the cover body, followed by pressing from a vertical direction. Subsequently, in a cover body placing step S3, the base substrate and the cover body are heated at a temperature of 200° C. or higher, and a voltage of several hundred volts is impressed while making a bonding material of the cover body as an anode and making the base substrate as a cathode, respectively, thereby boding the base substrate and the cover body to each other via the bonding material. On the occasion of bonding, the periphery is kept in vacuo.

Subsequently, in the conductive film forming step S4, a conductive film made of nickel is accumulated on the other surface of the base substrate by a vapor deposition method or a sputtering method. Subsequently, in the electrode pattern forming step S5, a mask is formed on the conductive film on which an electrode pattern is formed from a photosensitive resin film, and the conductive film is removed from a region other than the pattern of the mask by a wet etching method or a dry etching method. It is to be pointed out that the mask may also be formed by a printing method. Thereafter, the mask is removed to form an electrode pattern composed of the conductive film on the end face M of the through electrode 3 and on the surface of the periphery thereof.

Subsequently, in the external electrode forming step S6, an electroless plated film is accumulated on the surface of the electrode pattern by an electroless plating method, thereby forming an external electrode. It is to be pointed out that for the purpose of preventing the oxidation of the surface of the electroless plated film from occurring, thereby ensuring the conductivity, after the external electrode forming step S6, a metal film such as a gold thin film may also be formed on the surface of the electroless plated film by an electroless plating method.

Subsequently, in a cutting step S12, a scribe line is provided on the surface of the bonded body, and a cutting blade is pressed for cutting thereon. Alternatively, the bonded body is divided using a dicing blade or a dicing saw, thereby obtaining the individual electronic devices 1. Subsequently, in an electric characteristic inspecting step S13, a resonant frequency, a resonant resistance value, or the like of the electronic device 1 is measured and inspected.

Fourth Embodiment

Figure 6:
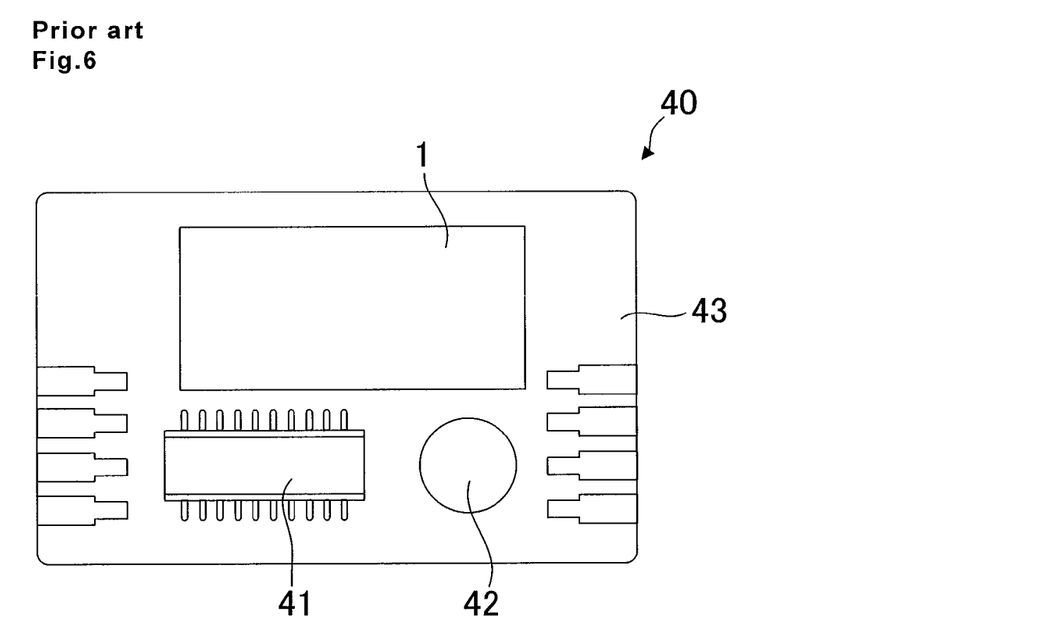
FIG. 6 is an upper schematic view of an oscillator according to Fourth Embodiment of the present invention.

FIG. 6 is an upper schematic view of an oscillator 40 according to Fourth Embodiment of the present invention. The electronic device 1 described above in the First Embodiment or the electronic device 1 manufactured by the manufacturing method described above in the Second or Third Embodiment is installed in the oscillator 40. As shown in FIG. 6, the oscillator 40 includes a substrate 43, the electronic device 1 placed on this substrate, an integrated circuit 41, and an electronic component 42. The electronic device 1 produces a signal of a fixed frequency on the basis of a drive signal given to an external electrode, and the integrated circuit 41 and the electronic component 42 process the signal of a fixed frequency supplied from the electronic device 1, thereby producing a reference signal such as a clock signal. Since the electronic device 1 according to the present invention can be formed so as to have high reliability and have a small size, it is possible to configure the whole of the oscillator 40 with a compact size.

What is claimed is:

1. A method for manufacturing an electronic device including
    providing an insulating base substrate having a first surface opposite a second surface;
    forming a through electrode in the insulating base substrate, the through electrode comprising a metal body filling a through-hole of the insulating base substrate, such that the metal body has an end face having flat surface and continuous with at least the second surface of the insulating base substrate;
    mounting an electronic element on the first surface of the insulating base substrate;
    bonding a cover body accommodating the electronic element therein to the insulating base substrate;
    forming a conductive film on the second surface of the insulating base substrate and on the end face of the through electrode exposed on the second surface;
    forming an electrode pattern by leaving a portion of the conductive film on the end face of the through electrode and on the second surface at a periphery of the end face of the through electrode; and
    forming an external electrode by accumulating an electroless plated film on a top surface and a side surface of the of the electrode pattern by an electroless plating method; and
    forming a metal film on the surface of the electroless plated film.

2. The method for manufacturing an electronic device according to claim 1, wherein forming the external electrode is carried out after mounting the electronic element and bonding the cover body.

3. The method for manufacturing an electronic device according to claim 1, wherein the metal body of the through electrode is composed of an iron-nickel based alloy.

4. The method for manufacturing an electronic device according to claim 1, wherein the electroless plated film is a nickel film or a copper film.

5. The method for manufacturing an electronic device according to claim 1, wherein the metal film is a gold thin film.

6. The method for manufacturing an electronic device according to claim 1, wherein the electroless plated film has a thickness of from 1 µm to 10 µm.

* * * * *

UNITED STATES PATENT AND TRADEMARK OFFICE
CERTIFICATE OF CORRECTION

PATENT NO. : 9,711,707 B2  
APPLICATION NO. : 14/161167  
DATED : July 18, 2017  
INVENTOR(S) : Atsushi Kozuki

Page 1 of 1

It is certified that error appears in the above-identified patent and that said Letters Patent is hereby corrected as shown below:

In the Claims

Claim 1, Column 10, Line 41, before "electrode pattern", please delete "of the"

Signed and Sealed this  
Eleventh Day of June, 2019

Andrei Iancu  
*Director of the United States Patent and Trademark Office*